United States Patent
Bao et al.

(10) Patent No.: US 8,398,779 B2
(45) Date of Patent: Mar. 19, 2013

(54) NON DESTRUCTIVE SELECTIVE DEPOSITION REMOVAL OF NON-METALLIC DEPOSITS FROM ALUMINUM CONTAINING SUBSTRATES

(75) Inventors: Liyuan Bao, Fremont, CA (US); Anbei Jiang, Sunnyvale, CA (US); Sio On Lo, Fremont, CA (US); Yukari Nishimura, Sunnyvale, CA (US); Joseph F. Sommers, San Jose, CA (US); Samantha S. H. Tan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 442 days.

(21) Appl. No.: 12/709,369

(22) Filed: Feb. 19, 2010

(65) Prior Publication Data

US 2010/0218788 A1   Sep. 2, 2010

Related U.S. Application Data

(60) Provisional application No. 61/156,728, filed on Mar. 2, 2009.

(51) Int. Cl.
*B08B 3/08* (2006.01)
(52) U.S. Cl. .................. 134/3; 134/2; 134/22.1; 134/41
(58) Field of Classification Search .................. None
See application file for complete search history.

(56) References Cited

U.S. PATENT DOCUMENTS

| | | | |
|---|---|---|---|
| 3,642,549 A | 2/1972 | Coutrue et al. | |
| 4,040,897 A | 8/1977 | Blish, II et al. | |
| 4,343,677 A | 8/1982 | Kinsbron et al. | |
| 4,517,106 A | 5/1985 | Hopkins et al. | |
| 5,162,259 A | 11/1992 | Kolar et al. | |
| 6,001,215 A | 12/1999 | Ban | |
| 7,112,289 B2 | 9/2006 | Mori et al. | |
| 7,624,742 B1 * | 12/2009 | Zuck | 134/1.3 |
| 7,854,777 B2 | 12/2010 | Takemiya et al. | |
| 2002/0119245 A1 | 8/2002 | Verhaverbeke | |
| 2002/0192897 A1 | 12/2002 | Molloy et al. | |
| 2003/0114014 A1 | 6/2003 | Yokoi et al. | |
| 2004/0168710 A1 | 9/2004 | Lee et al. | |

(Continued)

FOREIGN PATENT DOCUMENTS

| | | |
|---|---|---|
| EP | 0 351 771 A1 | 1/1990 |
| JP | 11087325 A | 3/1999 |

(Continued)

OTHER PUBLICATIONS

PCT International Search Report and Written Opinion for International Application No. PCT/US2010/025353, mailed Sep. 17, 2010, 8 pages.

(Continued)

*Primary Examiner* — Michael Kornakov
*Assistant Examiner* — Ryan Coleman
(74) *Attorney, Agent, or Firm* — Blakely Sokoloff Taylor & Zafman LLP

(57) ABSTRACT

Non-metallic deposits are selectively removed from aluminum containing substrates such as aluminum faceplates using a selective deposition removal (SDR) solution. The SDR solution does not substantially etch the faceplate holes, thereby preserving the hole diameter integrity and increasing the number of times the faceplate may be cleaned or refurbished while remaining within processing hole diameter tolerances. In an embodiment, the SDR solution comprises, in wt % of the solution, 15.5%+/−2% HF or buffered HF acid, 3.8%+/−0.5% $NH_4F$ pH buffer, 59.7%+/−5% ethylene glycol, and the balance $H_2O$.

8 Claims, 5 Drawing Sheets

U.S. PATENT DOCUMENTS

| | | |
|---|---|---|
| 2004/0171503 A1 | 9/2004 | Rovito et al. |
| 2005/0167393 A1* | 8/2005 | Tan et al. .................. 216/2 |
| 2005/0245409 A1 | 11/2005 | Cernat et al. |
| 2006/0073998 A1 | 4/2006 | Korzenski et al. |
| 2006/0131277 A1* | 6/2006 | Epton et al. ............. 216/102 |
| 2007/0248767 A1* | 10/2007 | Okura et al. ............. 427/534 |

FOREIGN PATENT DOCUMENTS

| | | |
|---|---|---|
| KR | 10-1998-0064909 A | 10/1998 |
| KR | 10-2003-0096707 A | 12/2003 |

OTHER PUBLICATIONS

PCT International Preliminary Report on Patentability for International Application No. PCT/US2010/025353, mailed Sep. 15, 2011, 5 pages.

* cited by examiner

| Location | Hole Diameter (inch) | | | | |
| --- | --- | --- | --- | --- | --- |
| | Hole 1 | Hole 5 | Hole 9 | Hole 13 | Center |
| Pre-Clean | 0.0161 | 0.0160 | 0.0161 | 0.0161 | 0.0161 |
| 120 min | 0.0161 | 0.0159 | 0.0160 | 0.0160 | 0.0161 |
| 180 min | 0.0161 | 0.0160 | 0.0160 | 0.0160 | 0.0161 |
| 300 min | 0.0160 | 0.0160 | 0.0160 | 0.0160 | 0.0160 |

FIG. 4

NON DESTRUCTIVE SELECTIVE DEPOSITION REMOVAL OF NON-METALLIC DEPOSITS FROM ALUMINUM CONTAINING SUBSTRATES

RELATED APPLICATIONS

The present patent application hereby claims the priority benefit of U.S. Provisional Patent Application No. 61/156,728, filed Mar. 2, 2009.

BACKGROUND

1. Field

Embodiments of the present invention relate to the field of chamber component cleaning and refurbishment.

2. Background Information

The fabrication of semiconductor devices typically comprises forming multiple layers, including non-metallic layers such as interlayer dielectrics, etch stop layers, and passivation layers. Many of these layers are often deposited using chemical vapor deposition (CVD) methods. Such deposition methods also form deposits of the deposition species on internal chamber components such as a faceplate, also known as a showerhead, of a gas distribution assembly.

Deposits must be routinely removed from the internal chamber surfaces so that they do not serve as a contamination source. Plasma cleaning chemistries can be utilized to clean the chamber components in situ. Alternatively the chamber components can be removed from the chamber and cleaned in solution ex situ. Such cleaning solutions generally comprise a chemistry of nitric acid ($HNO_3$) and hydrofluoric acid (HF).

SUMMARY

Embodiments of the present invention disclose a cleaning solution and method for removing deposits from chamber components.

In an embodiment, the cleaning solution is a selective deposition removal (SDR) solution for selectively removing a non-metallic deposit from an aluminum containing substrate. In an embodiment, the SDR solution comprises at least one acid, a pH buffer to donate a hydronium ion, a straight or branched chain-diol or -triol from the $C_2$ to $C_6$ chain to protect the aluminum containing substrate from the acid, and water ($H_2O$). In an embodiment, the SDR solution comprises, in wt % of the solution, 15.5%+/−2% HF or buffered HF acid, 3.8%+/−0.5% $NH_4F$ pH buffer, 59.7%+/−5% ethylene glycol, and the balance $H_2O$.

In an embodiment, the SDR solution may be contacted with the aluminum containing substrate to remove the non-metallic deposit without substantially reacting with the aluminum containing substrate. Utilizing embodiments of the present invention, aluminum containing substrates such as aluminum faceplates can be cleaned without substantially etching the faceplate holes, thereby preserving the hole diameter integrity and increasing the number of times the faceplate may be cleaned or refurbished while remaining within processing hole diameter tolerances.

BRIEF DESCRIPTION OF THE DRAWINGS

FIG. 4 is a chart illustrating individual faceplate hole size measurements for different SDR cleaning solution exposure times at room temperature.

DETAILED DESCRIPTION

Figure 1:
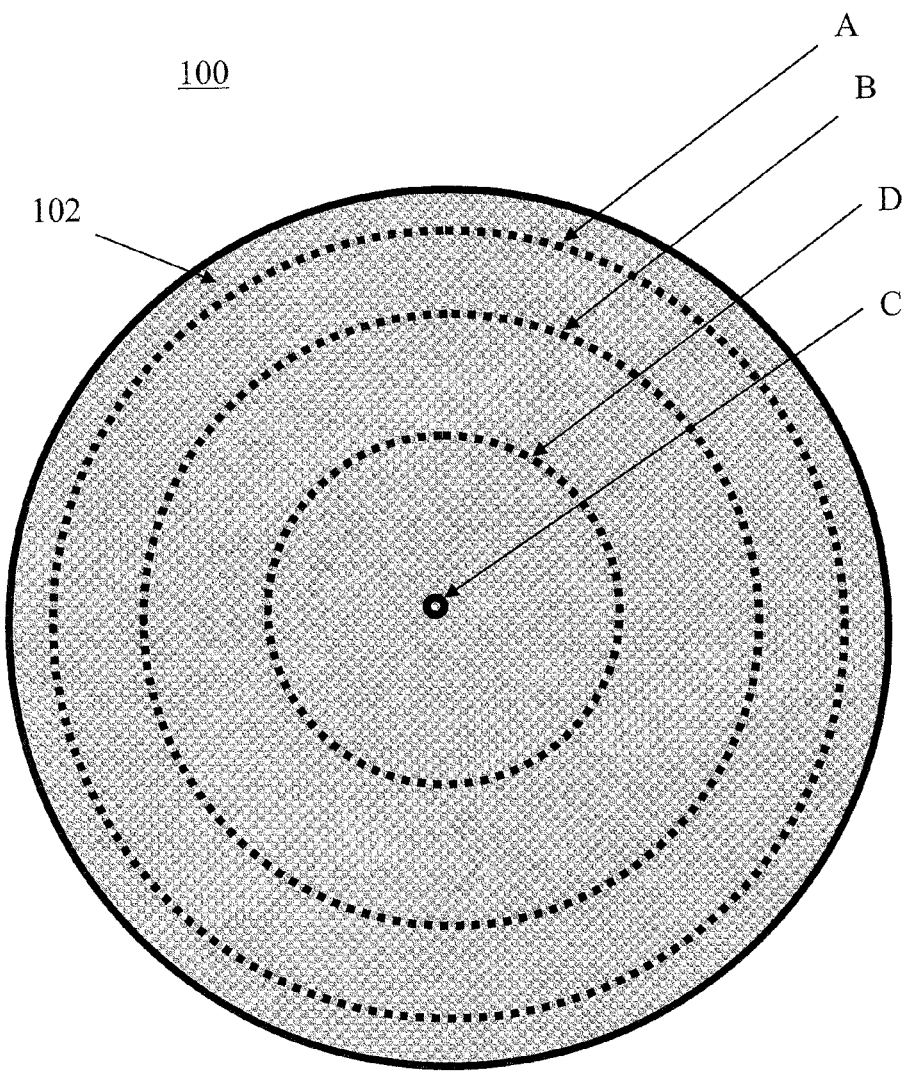
FIG. 1 is a top view illustration of a faceplate including multiple holes.
Figure 2A:
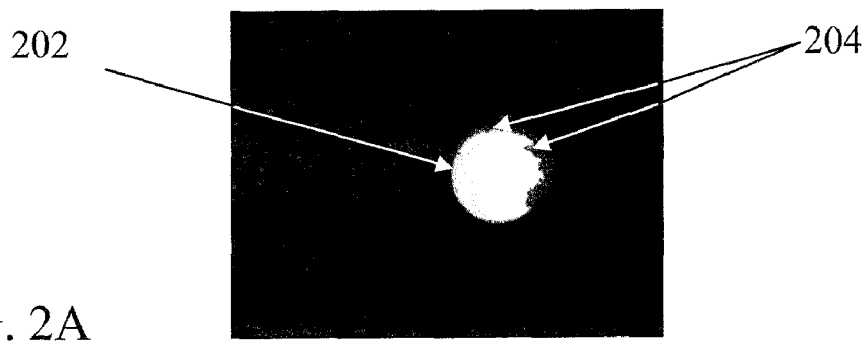
FIG. 2A-FIG. 2D are a series of top view images of a faceplate hole illustrating the removal of BLOk.TM deposits for different SDR cleaning solution exposure times at room temperature.
Figure 2B:
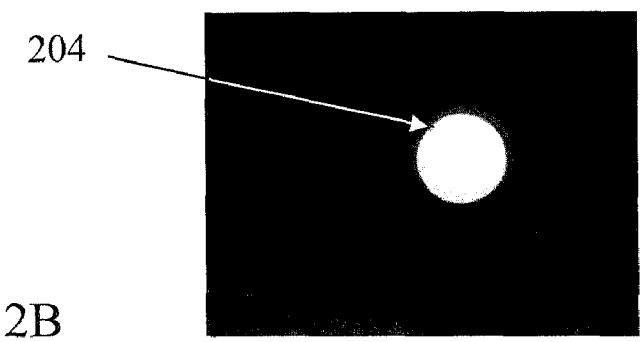
Figure 2C:
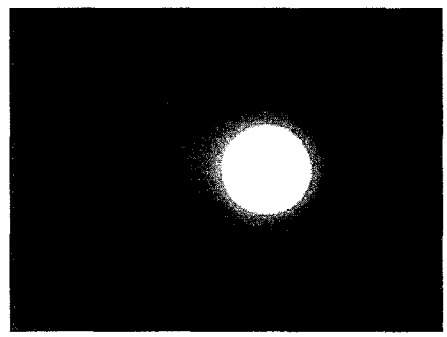
Figure 2D:
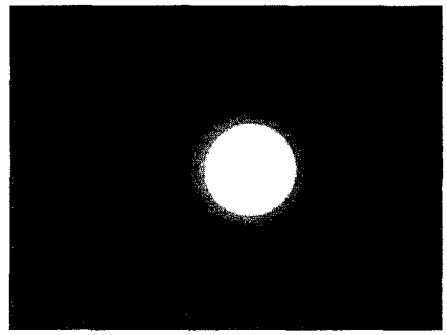

Embodiments of the present invention disclose a cleaning solution and method for removing deposits from chamber component surfaces.

Various embodiments described herein are described with reference to figures. However, certain embodiments may be practiced without one or more of these specific details, or in combination with other known methods and configurations. In the following description, numerous specific details are set forth, such as compositions, and processes, etc., in order to provide a thorough understanding of the present invention. Reference throughout this specification to "one embodiment" or "an embodiment" means that a particular feature, configuration, composition, or characteristic described in connection with the embodiment is included in at least one embodiment of the invention. Thus, the appearances of the phrase "in one embodiment" or "an embodiment" in various places throughout this specification are not necessarily referring to the same embodiment of the invention. Furthermore, the particular features, configurations, compositions, or characteristics may be combined in any suitable manner in one or more embodiments.

In accordance with embodiments, non-metallic deposits can be selectively removed from aluminum containing substrates such as aluminum faceplates using a selective deposition removal (SDR) solution. The SDR solution does not substantially etch the faceplate holes, thereby preserving the hole diameter integrity and increasing the number of times the faceplate may be cleaned or refurbished while remaining within processing hole diameter tolerances. In an embodiment, the SDR solution comprises, in wt % of the solution, 15.5%+/−2% HF or buffered HF acid, 3.8%+/−0.5% $NH_4F$ pH buffer, 59.7%+/−5% ethylene glycol, and the balance $H_2O$.

The deposits that may be removed using the methods described herein include non-metallic materials, non-metallic oxides such as silicon oxide ($SiO_2$), carbon-doped oxides (CDO), silicon-carbon-hydrogen (SiCH), non-metallic nitrides such as silicon nitride ($Si_3N_4$), non-metallic carbides such as silicon carbide (SiC), and other non-metallic dielectric materials. The deposits may also include residues associated with plasma cleaning of a processing chamber component such as $AlF_3$.

An example of a processing chamber component that may be cleaned or refurbished using the methods described herein is an aluminum faceplate from the PRODUCER.RTM. chemical vapor deposition (CVD) reactor, available from Applied Materials, Inc. of Santa Clara, Calif. Embodiments may also be utilized to clean or refurbish other aluminum containing substrates such as aluminum and aluminum alloy substrates.

As used herein, "selectively removing" (or derivations thereof) is intended to mean removing or stripping a deposit from a substrate without substantially etching or eroding the underlying substrate. As used herein "without substantially etching" (or derivations thereof) is intended to mean no detectable attack on the underlying substrate as determined by visual inspection or microscopic measurement to the ten thousandths of an inch (0.0001 inch).

In an embodiment, the cleaning solution is a selective deposition removal (SDR) solution for selectively removing a non-metallic deposit from an aluminum containing substrate. In an embodiment, the SDR solution comprises at least one acid, a pH buffer, a straight or branched chain-diol or -triol from the $C_2$ to $C_6$ chain to protect the aluminum containing substrate from the acid, and water ($H_2O$). In an embodiment, the SDR solution comprises, in wt % of the solution, 15.5%+/−2% HF or buffered HF acid, 3.8%+/−0.5% $NH_4F$ pH buffer, 59.7%+/−5% ethylene glycol, and the balance $H_2O$.

It is believed that the selective removal of the non-metallic deposit from an aluminum containing substrate is associated with the presence of a straight or branched chain-diol or -triol from the $C_2$ to $C_6$ chain such as ethylene glycol in an amount sufficient to form an ethoxide layer on at least one portion of the aluminum containing substrate not covered with the deposit, i.e. the exposed substrate. Due to this protective ethoxide layer, the aluminum substrate is protected from being attacked by the acid in the SDR solution such as HF. The protective ethoxide layer may form on a portion of the substrate not originally covered with a deposit, as well as form after the deposit is removed from a portion of the substrate. As a result, the ethylene glycol protects the substrate from attack by the acid component in the SDR solution during prolonged exposure times of 180 minutes or longer. In other embodiments, the substrate protector component may include any straight or branched chain-diol or -triol from the $C_2$ to $C_6$ chain such as propylene glycol, butanediol, ethylene glycol, or glycerol and combinations thereof at 59.7%+/−5% by weight of the SDR solution.

In an embodiment, the acid component comprises 15.5%+/−2% by weight of the SDR solution. In an embodiment, the acid component comprises a fluorine ion, such as HF or buffered HF. In an embodiment, the buffered HF is 49% by wt HF, with the remainder water. In another embodiment, the acid may comprise other acids such as hydrochloric, sulfuric, nitric, sodium bifluride, ammonium fluoroborate, and barium fluoride. Any one or a combination of these ingredients may be present in the SDR solution in amount ranging from 15.5%+/−2% by weight of the SDR solution. For example, the acid component may be 49% by weight buffered HF comprising 15.5 from 15.5%+/−2% by weight of the SDR solution.

In an embodiment, the pH buffer component comprises 3.8%+/−0.5% by weight of the SDR solution. In an embodiment, the pH buffer comprises a component which is able to donate a hydronium ion ($H^+$) so that the pH of the SDR solution does not significantly change during deposit removal, and from substrate to substrate sequentially cleaned in the same SDR solution bath. As the acid component of the SDR solution reacts with the deposit hydronium is consumed. In an embodiment, the pH buffer component comprises ammonium fluoride ($NH_4F$).

The remainder of the SDR solution is comprised of water. Though additives such as surfactants and pH modifiers may be included in the SDR solution in place of or part of the water balance.

The SDR solution may be applied to a substrate utilizing several available techniques such as exposing the substrate to a timed immersion in a wet chemical bath or a spray from a chemical spray tool until the deposit is completely removed. Such a process can be multi-step in so far as there may be a cycle of strip-inspect-strip-inspect until removal is complete.

In an embodiment, an aluminum containing substrate is submerged in a bath of SDR solution to remove the non-metallic deposit without substantially reacting with the aluminum containing substrate. Necessary exposure time to the SDR solution may depend upon the deposit composition and thickness. In an embodiment, the deposit is a non-metallic oxide such as silicon oxide ($SiO_2$), carbon-doped oxide (CDO), silicon-carbon-hydrogen (SiCH), non-metallic nitride such as silicon nitride ($Si_3N_4$), non-metallic carbide such as silicon carbide (SiC), or other non-metallic dielectric material. In an embodiment, the deposit is an $AlF_3$ residue. In an embodiment, the deposit may be a BlOk.TM film, which is an amorphous film composed of silicon, carbon and hydrogen (a-SiC:H), having a thickness of several microns. In an embodiment the aluminum containing substrate is a faceplate consisting essentially of aluminum. For example, the faceplate can be from the PRODUCER.RTM. chemical vapor deposition (CVD) reactor.

FIG. 1 is a top view illustration of a faceplate 100 including a plurality of holes 102. Throughout various locations in the present disclosure reference is made to a specific hole number in the faceplate 100. For illustrative purposes only, holes 1-24 are located along an outer ring A, holes 25-40 are located along a middle ring B, holes 41-48 are located along an inner ring D, and hole 49 is located in the center C of faceplate 100.

FIG. 2A-FIG. 2D are a series of top view images of a faceplate hole 202 illustrating the removal of BLOk.TM (a SiC based material) deposits 204 for different SDR cleaning solution exposure times at room temperature. As shown, BLOk.TM deposits are visible prior to cleaning with SDR solution in FIG. 2A, the BLOk.TM deposits 204 are partially removed after being submerged in SDR solution at room temperature for 120 minutes in FIG. 2B. The BLOk.TM deposits 204 are completely removed after being submerged in SDR solution at room temperature for 180 minutes in FIG. 2C, and after being submerged in SDR solution at room temperature for 300 minutes in FIG. 2D.

Figure 3:
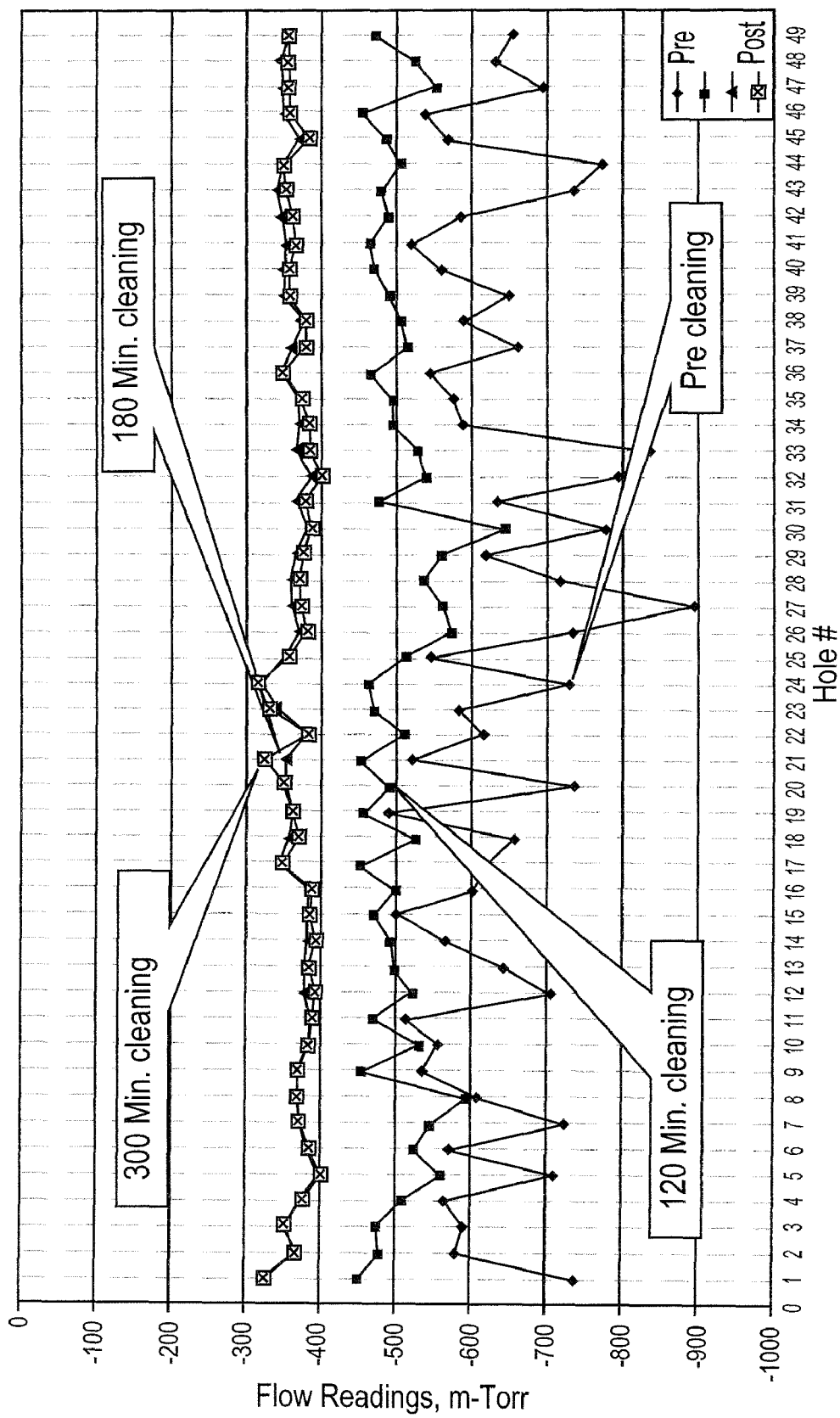
FIG. 3 is a chart illustrating flow measurements through individual faceplate holes for different SDR cleaning solution exposure times at room temperature.

FIG. 3 is a chart illustrating flow measurements through individual faceplate holes initially covered with BLOk.TM deposits for different SDR cleaning solution exposure times at room temperature, with the individual faceplate holes corresponding to those illustrated in FIG. 1. As shown, prior to cleaning with SDR solution the flow readings through the faceplate holes is restricted and non-uniform. After submerging the faceplate in SDR solution for 120 minutes at room temperature the flow rate reading is increased and more uniform. After submerging the faceplate in SDR solution for 180 minutes flow readings and uniformity is again increased. Measurements after 300 minutes are similar to those at 180 minutes indicating that the BLOk.TM deposits are completely removed after 180 minutes. Accordingly, the results of FIG. 2 and FIG. 3 are consistent that BLOk.TM deposits are completely removed after being submerged in SDR solution at room temperature for 180 minutes.

FIG. 4 is a chart illustrating individual faceplate hole size microscopic measurements for different SDR cleaning solution exposure times at room temperature. As shown in FIG. 4, the faceplate has a uniform hole size of 0.0161 inches prior to being exposed to SDR solution. Even after being submerged in SDR solution for an interval of 300 minutes the microscopically measured hole size does not increase. Accordingly, the measurements show that there is no substantial change in hole size after immersion in SDR solution at room temperature for 300 minutes. This represents a significant improvement over conventional removal solutions, such as $HNO_3$/HF solutions which also attack the aluminum faceplates and result in increased hole sizes after shorter exposure times. As illustrated in FIG. 4 the diameter of the faceplate holes did not increase when microscopically measured to the ten thousandths of an inch (0.0001 inch). Accordingly, utilizing embodiments of the present invention, aluminum containing substrates such as aluminum faceplates can be cleaned without substantially etching the faceplate holes, thereby preserving the hole diameter integrity and increasing the number of times the faceplate may be cleaned or refurbished while remaining within processing hole diameter tolerances.

Figure 5A:
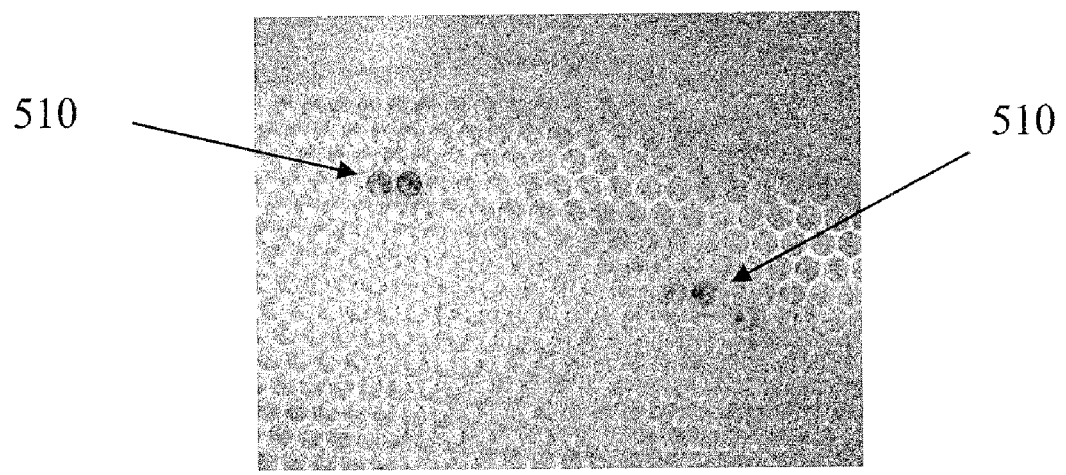
FIG. 5A is a top view image of a faceplate illustrating surface staining due to arcing across holes pre-SDR cleaning.
Figure 5B:
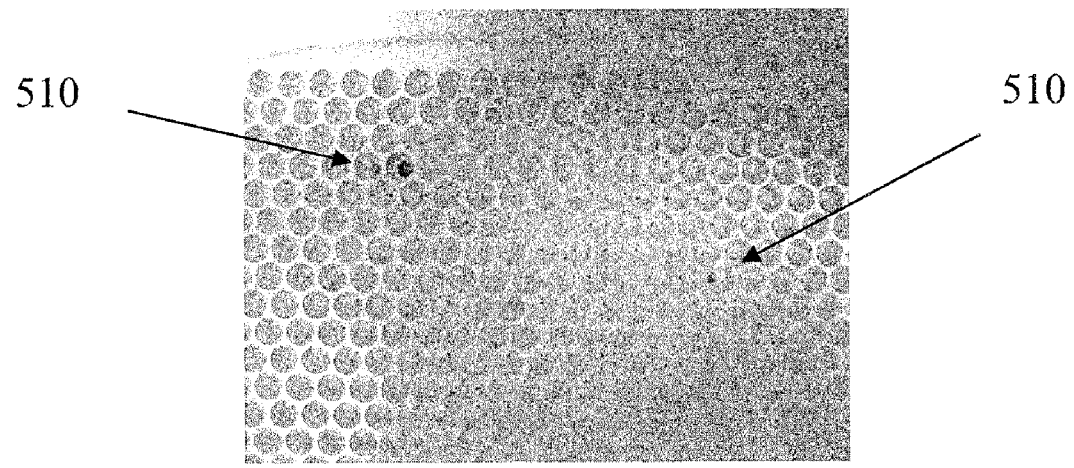
FIG. 5B is a top view image of a faceplate illustrating the removal of surface staining due to arcing across holes post-SDR cleaning for 180 minutes at room temperature.

The SDR solution and cleaning methods in accordance with embodiments provide additional benefits over conventional cleaning methods. For example, the SDR solution can effectively clean faceplates having surface staining arcing holes without substantially etching the arcing holes. FIG. 5A is a top view image of a faceplate illustrating surface staining (indicated by the comparatively darker holes) due to arcing across holes 510 pre-SDR cleaning. As illustrated in FIG. 5B the surface staining due to arcing across holes 510 is completely removed after cleaning in SDR solution for 180 minutes at room temperature. Where surface staining is present due to arcing across holes, the deposit may be partially or completely burned off at the arcing sites. As a result, conventional cleaning solutions preferentially attack the holes of an aluminum faceplate where arcing has occurred which results in an increased hole size. Utilizing embodiments of the present invention, aluminum faceplates including surface staining due to arcing across holes can be cleaned to remove the surface staining without increasing the hole size.

The SDR solution and cleaning methods in accordance with embodiments also allow for the independent adjustment of the surface texture (or surface roughness) since the SDR solution does not substantially etch aluminum. For example, where the substrate is to be used in a CVD chamber it may be preferred to have a specific surface roughness to trap the deposits and prevent the deposits from contaminating the workpiece being processed. In an embodiment, the post treatment may include exposing the substrate to a 90/10 $NHO_3$/HF chemistry for several minutes. the post treatment can be utilized to roughen the surface of the substrate.

In the foregoing specification, various embodiments of the invention have been described. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method for selectively removing a non-metallic deposit from an aluminum containing faceplate comprising:
    contacting an aluminum containing faceplate including a plurality of holes with a solution until a non-metallic deposit is removed from the faceplate, the solution comprising:
    15.5%+/−2% HF or buffered HF acid;
    3.8%+/−0.5% $NH_4F$ pH buffer;
    59.7%+/−5% a straight or branched chain-diol or -triol from the $C_2$ to $C_6$ chain; and
    water;
    wherein the non-metallic deposit is a dielectric.

2. The method of claim 1, wherein the straight or branched chain-diol or -triol from the $C_2$ to $C_6$ chain is ethylene glycol.

3. The method of claim 1, wherein the dielectric is selected from the group consisting of a-SiC:H, $SiO_2$ and SiC.

4. The method of claim 3, wherein contacting comprises submersing the faceplate in the solution for 180 minutes or longer.

5. The method of claim 4, wherein the plurality of holes have a diameter, and the diameter of the plurality of holes is not increased by 0.0001 inch during the contacting.

6. The method of claim 5, further comprising exposing the faceplate to an acid to increase the surface roughness of a surface of the faceplate after contacting the faceplate with the solution.

7. The method of claim 5, wherein the faceplate includes surface staining due to arcing across holes.

8. The method of claim 4, wherein the contacting is performed at approximately room temperature.

* * * * *